US008779582B2

(12) United States Patent
Lin et al.

(10) Patent No.: US 8,779,582 B2
(45) Date of Patent: Jul. 15, 2014

(54) COMPLIANT HEAT SPREADER FOR FLIP CHIP PACKAGING HAVING THERMALLY-CONDUCTIVE ELEMENT WITH DIFFERENT METAL MATERIAL AREAS

(75) Inventors: Wen-Yi Lin, Wugu Township (TW); Po-Yao Lin, Zhudong Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 112 days.

(21) Appl. No.: 13/015,831

(22) Filed: Jan. 28, 2011

(65) Prior Publication Data

US 2012/0098118 A1    Apr. 26, 2012

Related U.S. Application Data

(60) Provisional application No. 61/405,017, filed on Oct. 20, 2010.

(51) Int. Cl.
*H01L 23/34* (2006.01)
*H01L 23/10* (2006.01)

(52) U.S. Cl.
USPC ....... 257/713; 257/706; 257/718; 257/E23.11

(58) Field of Classification Search
USPC ............ 257/704, 706, 712, 718, 720, E23.08, 257/E23.087, E23.101, E23.102, E23.11
See application file for complete search history.

(56) References Cited

U.S. PATENT DOCUMENTS

| 5,247,426 | A  | * | 9/1993  | Hamburgen et al. | 361/705 |
| 6,248,959 | B1 | * | 6/2001  | Sylvester | 174/256 |
| 6,607,942 | B1 | * | 8/2003  | Tsao et al. | 438/122 |
| 6,665,187 | B1 | * | 12/2003 | Alcoe et al. | 361/719 |
| 6,784,535 | B1 | * | 8/2004  | Chiu | 257/704 |
| 6,804,966 | B1 | * | 10/2004 | Chu et al. | 62/3.7 |
| 7,619,308 | B1 | * | 11/2009 | Gektin et al. | 257/704 |
| 2005/0068739 | A1 | * | 3/2005 | Arvelo et al. | 361/718 |
| 2005/0121775 | A1 | * | 6/2005 | Fitzgerald et al. | 257/707 |
| 2006/0261469 | A1 | * | 11/2006 | Ni et al. | 257/718 |
| 2007/0009687 | A1 | * | 1/2007 | Edwards et al. | 428/34.1 |
| 2008/0128897 | A1 | * | 6/2008 | Chao | 257/713 |

* cited by examiner

*Primary Examiner* — Daniel Luke
*Assistant Examiner* — Khaja Ahmad
(74) *Attorney, Agent, or Firm* — Lowe Hauptman & Ham, LLP

(57) ABSTRACT

An integrated circuit chip package is described. The integrated circuit package comprises a substrate, a chip attached to the substrate, and a heat spreader mounted over the chip for sealing the chip therein. The heat spreader includes a thermally-conductive element having a side opposed to the top of the chip for transmitting heat away from the chip to the heat spreader, and a compliant element having a first portion attached to and positioned around the periphery of the thermally-conductive element and a second portion affixed to a surface of the substrate.

27 Claims, 3 Drawing Sheets

COMPLIANT HEAT SPREADER FOR FLIP CHIP PACKAGING HAVING THERMALLY-CONDUCTIVE ELEMENT WITH DIFFERENT METAL MATERIAL AREAS

CROSS-REFERENCE TO RELATED APPLICATIONS

The present application claims priority of U.S. Provisional Patent Application Ser. No. 61/405,017, filed on Oct. 20, 2010, which is incorporated herein by reference in its entirety.

FIELD

The disclosure relates generally to the fabrication of flip chip packages, and more particularly, to flip chip packages having compliant heat spreaders with enhanced mechanical and thermal performance.

BACKGROUND

In the semiconductor chip package industry, a chip carrying an integrated circuit is commonly mounted on a package carrier such as a substrate, a circuit board or a leadframe that provides electrical connections from the chip to the exterior of the package. In such packaging arrangement called flip chip mounting, where the active side of the chip is mounted in an upside-down fashion over the substrate, the chip and the substrate are usually formed of different materials having mismatched coefficients of thermal expansion. As a result, the chip and the substrate experience significantly different dimension changes when heated, and the mismatch in dimension changes causes significant thermally-induced stresses and warpage in the electrical connections between the chip and the substrate. If uncompensated, the disparity in thermal expansion can result in degradation in the performance of the chip, damage to the solder connections between the chip and the substrate, or package failure.

To reduce warpage and improve the reliability of flip chip packages, a number of approaches have been offered by the microelectronics industry. An encapsulant material or underfill is commonly used to fill the gap between the chip and the substrate to reduce the stress on the package during thermal cycling. Additionally, stiffeners are typically employed around the chip in the package assembly. The stiffeners are attached on the substrate and surround the chip to constrain the substrate in order to prevent chip warpage or other movement relative to the chip during thermal cycling. To further reduce the chance of warpage and promote thermal cooling of flip chip packages, heat spreaders are often mounted on top of the package to dissipate heat and counter-balance the forces exerted by the thermal expansion mismatches between at least the chip and the substrate.

Although heat spreaders and stiffeners reduce warpage, as the package is constrained by the heat spreader, there may be high stress on the solder joints between the chip and the substrate. Moreover, as the stiffener is attached onto the substrate, stress may be imposed on the substrate as it is being constrained by the stiffener. The stress on the substrate and chip may lead to chip performance degradation or package failure. Furthermore, for thermal applications the conventional heat spreader having a highly homogeneous conductive material is likely not suitable for component or system-level package designs, where non-uniform heating of the chip often occurs during operation.

BRIEF DESCRIPTION OF DRAWINGS

The features, aspects, and advantages of the disclosure will become more fully apparent from the following detailed description, appended claims, and accompanying drawings in which:

DETAILED DESCRIPTION

In the following description, numerous specific details are set forth to provide a thorough understanding of embodiments of the present disclosure. However, one having an ordinary skill in the art will recognize that embodiments of the disclosure can be practiced without these specific details. In some instances, well-known structures and processes have not been described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
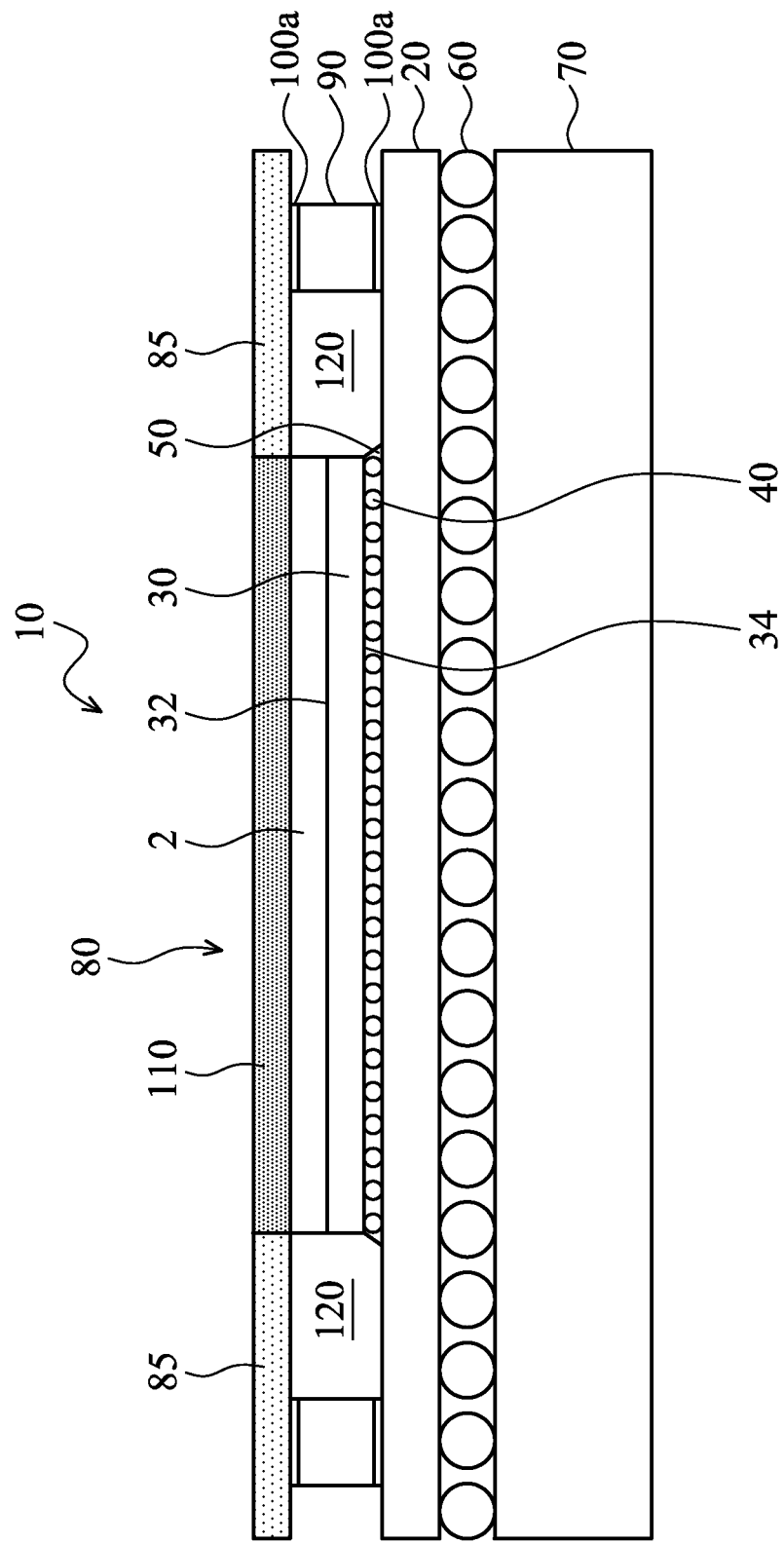
FIG. 1 is a cross-sectional view of a semi-finished flip chip package having a compliant heat spreader according to an aspect of the present disclosure.

With reference to FIG. 1, illustrated is a cross-sectional view of a semi-finished flip chip package 10 having a compliant heat spreader 80 according to an aspect of the present disclosure. Flip chip package 10 includes a semiconductor device such as an integrated circuit chip (hereinafter referred to as chip 30). Chip 30 may be a single chip, multiple chips, a single component, multiple components, or a combination of chip(s) and component(s). Chip 30 has a rear surface 32 and a front surface 34 being opposite the rear surface 32. A set of solder bumps 40 is connected to contact pads (not shown) on the front surface 34 of chip 30. Chip 30 is secured to a first substrate 20 underlying chip 30 by a set of solder bumps 40. First substrate 20 may be either an inorganic substrate such as, for example $Al_2O_3$ or an organic substrate such as, for example FR-4 or build up plastics. Solder bumps 40 are attached to contact pads (not shown) on a top surface of first substrate 20. Although solder bumps 40 are employed to couple chip 30 to first substrate 20, it is understood by those of ordinary skill in the art that any means for coupling chip 30 to first substrate 20 are contemplated and within the scope of the present disclosure.

To improve the reliability of electrical connections in flip chip package assemblies, an encapsulant material or underfill 50 may be filled in the gap between chip 30 and first substrate 20. Underfill 50 protects chip 30 from flexural damage thereby increasing the fatigue life of the flip chip package 10. Underfill 50 may include, for example a commercially available epoxy polymer.

A set of solder balls 60 may be secured to contact pads (not shown) on a bottom surface of first substrate 20 for connection to a second substrate 70. Second substrate 70 may be a printed wire board (also sometimes called a printed circuit board) or may be a multilayer module known to those skilled in the art.

Some flip chip packaging technologies known to the applicants often employ heat spreaders and/or stiffeners to counter-balance the forces exerted by the thermal expansion mismatches between at least the chip and the substrate when the package undergoes a thermal cycling event. However, because the flip chip package is constrained by the heat spreader, high stress may be imposed on the solder bumps 40 between the chip 30 and the first substrate 20. This stress may undermine the solder joint reliability of the package and thus lead to chip performance degradation or package failure. Accordingly, with respect to an aspect of the present disclosure the flip chip package 10 includes a compliant heat spreader 80. Compliant heat spreader 80 may be a one-piece lid structure that mounts on first substrate 20 over the chip 30 to seal chip 30 therein or mounted above a stiffener 90, as depicted in FIG. 1. In FIG. 1, stiffener 90 is mounted above the top surface of first substrate 20 and around chip 30 to define a cavity region 120 therebetween. Stiffener 90 may be secured to first substrate 20 by means of adhesive 100a.

The compliant heat spreader 80 comprises a thermally conductive element 110 and a compliant element 85. The thermally conductive element 110 has a side facing opposite the top surface of chip 30 for transmitting heat away from chip 30 to the compliant heat spreader 80. The compliant element 85 has a first portion attached to and positioned around the periphery of the thermally conductive element 110 and a second portion affixed to a surface of the stiffener 90 as depicted in FIG. 1 or to a surface of the first substrate 20 (not shown), according to an embodiment where the flip chip package 10 does not use stiffeners.

Figure 2:
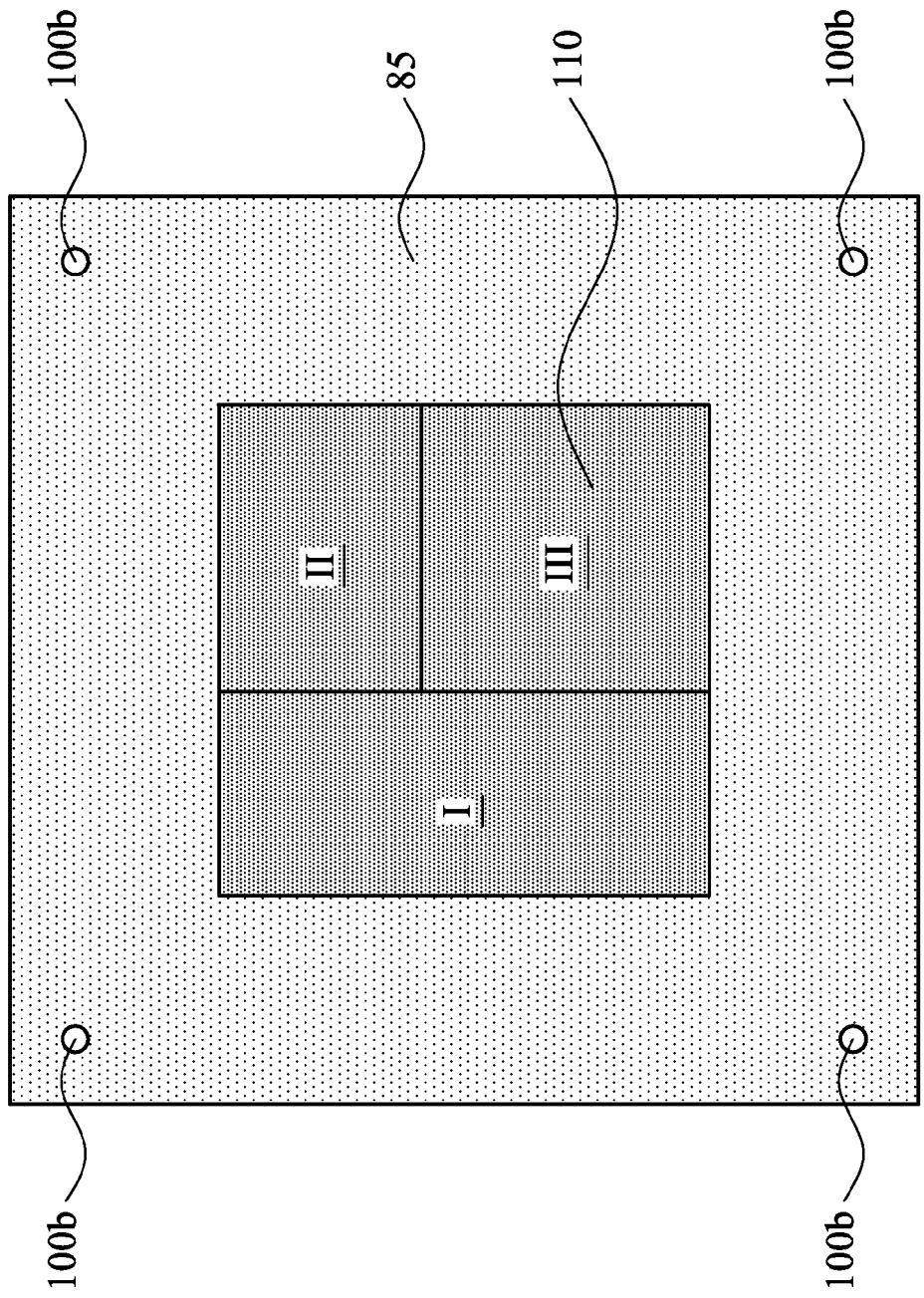
FIG. 2 is a top view of the flip chip package of FIG. 1.
Figure 3:
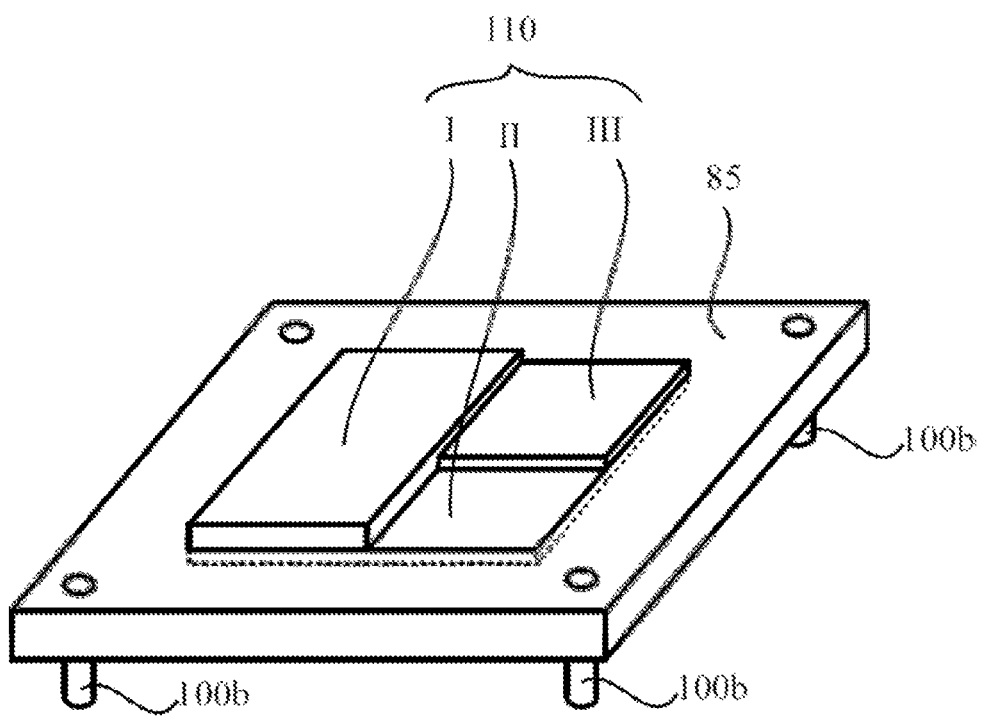
FIG. 3 is a perspective view of the flip chip package of FIG. 1.

The thermally conductive element 110 of the compliant heat spreader 80 comprises a thermally conductive material for dissipating the heat generated by chip 30. The thermally conductive element 110 may comprise a metal such as copper, copper alloy, aluminum, aluminum alloy, carbon compound, steel, steel alloy, or other conductive materials. According to one embodiment, the thermally conductive element 110 comprises a single metal material. For component or system-level flip chip package designs where non-uniform heating of the chip occurs during operation, according to another embodiment the thermally conductive element 110 comprises one or more different metal materials. As depicted in FIG. 2 and FIG. 3, thermally conductive element 110 comprises three distinct metal regions: metal area I, metal area II, and metal area III. The different metal regions are tailored to accommodate the different amount of heat generated by chip 30 for optimal heat dissipation efficiency and to balance varying heat dissipation rates among metal area I, metal area II, and/or metal area III. For example, assume that the area of chip 30 under metal area I produces more heat than the other areas of the chip, then in order to efficiently dissipate heat metal area I may comprise copper (as opposed to less thermal conductive metals) whereas metal areas II and III may comprise aluminum. Although FIG. 2 and FIG. 3 depict thermally conductive element 110 as having three independent metal regions, it is to be understood, of course that thermally conductive element 110 may comprise any number of metal areas, each having a different metal material to accommodate the non-uniform heating of chip 30.

According to some embodiments, a shape, size and/or thickness of one or more areas of the thermally conductive element 110 can be adapted to match the non-uniform heat signatures from the various parts of chip 30 for optimal heat dissipation efficiency. In other embodiments, a material, size, shape and/or thickness of one or more areas of the thermally conductive element 110 can be adapted to match the coefficient of thermal expansion (CTE) of chip 30 and/or first substrate 20.

With reference to compliant element 85, the compliant element 85 is a material that is pliable yet maintains dimensional stability and has resistance to high temperatures. As the compliant element 85 is pliable and offers a degree of flexibility in relation to the flip chip package less stress will be imposed on the solder joints between the chip and the substrate with the heat spreader and/or stiffener attached to the substrate. Forces generated by the CTE mismatches are to some degree absorbed/redistributed by the compliant element 85. With less stress, there is a lower likelihood of the flip chip package suffering from package failure. In at least one embodiment, the CTE of the compliant element 85 can be adapted to match the CTE of the substrate 20. In at least one embodiment, the compliant element has a lower thermal conductivity than that of the thermally-conductive element. In another embodiment, the thermal conductivity rate of the compliant element varies with the thermal conductivity rate of the thermally-conductive element.

Compliant heat spreader 80 can be manufactured by an injection molding process and the compliant element 85 may comprise a plastic, a resin, a polymer-based material, a thermoplastic material, an epoxy resin material, a polyester material, a dielectric material, or a silicon-containing material. Other methods for forming the compliant heat spreader 80 and other materials for compliant element 85 are also contemplated and within the scope of the present disclosure. In the embodiment where the compliant heat spreader 80 is a one-piece lid structure, compliant element 85 may be affixed to the first substrate by way of screws, fasteners, pins, rods, clamps, adhesives, or epoxies (as indicated by reference numeral 100b). Other methods of attaching the compliant element 85 to the first substrate are also contemplated and within the scope of the present disclosure. In the embodiment where the compliant heat spreader 80 is mounted above stiffener 90, the compliant element 85 may be mounted to stiffener 90 by way of screws, fasteners, pins, rods, clamps, adhesives, or epoxies (as indicated by reference numerals 100a and 100b). Other methods of attaching the compliant element 85 to the first substrate are also contemplated and within the scope of the present disclosure.

Also shown in FIG. 1, the flip chip package 10 may include a thermal interface material (TIM) 2 disposed between chip 30 and compliant heat spreader 80. TIM 2 transfers heat generated by chip 30 to the compliant heat spreader 80, which then spreads the heat to other elements, such as a heat sink (not shown) or the ambient. TIM 2 may be a thermal grease type material or a rigid type material (such as epoxy or solder).

Embodiments of the flip chip package employing a compliant heat spreader having a thermally conductive element and a compliant element reduces package warpage whilst at the same time lowers the stress at the solder joint between the chip and the substrate that is otherwise incurred by constraints of the conventional homogenous heat spreader and/or stiffener. In other words, the forces generated by the CTE mismatches are to some degree absorbed/redistributed by the compliant heat spreader and the risk of package failure is greatly reduced. Also, embodiments of the flip chip package employing the compliant heat spreader enjoys optimal heat dissipation efficiency by providing one or more metal areas, each having a different conductive material, size, and/or shape to accommodate the non-uniform heating of the chip.

In the preceding detailed description, the present invention is described with reference to specifically exemplary embodiments thereof. It will, however, be evident that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the invention as expressed herein.

What is claimed is:

1. An integrated circuit chip package, comprising:
   a substrate;
   a chip attached to the substrate; and
   a heat spreader mounted over the chip for sealing the chip therein, the heat spreader comprising:
      a passive, thermally-conductive element having a side opposed to a top surface of the chip for transmitting heat away from the chip to the heat spreader, the thermally-conductive element comprising two horizontally distinct, thermally-conductive areas, positioned side by side in a direction parallel to the top surface of the chip, having different thermal conductivity, the thermally-conductive areas comprising different metals, wherein each horizontally distinct, thermally-conductive area of the two horizontally distinct, thermally-conductive areas comprises a single metal;
      a compliant element having a first portion attached to and positioned around a periphery of the thermally-conductive element and a second portion affixed to a surface of the substrate by a stiffener, wherein the thermally-conductive element has thermal conductivity higher than that of the compliant element, and
   wherein a surface of the compliant element closest to the top surface of the chip and a surface of the thermally-conductive element closest to the top surface of the chip are substantially coplanar where the first portion of the compliant element meets the periphery of the thermally-conductive element.

2. The integrated circuit chip package of claim 1, further comprising a thermal interface material (TIM) disposed between the chip and the heat spreader for transmitting heat generated from the chip to the heat spreader.

3. The integrated circuit chip package of claim 1, wherein the compliant element is pliable yet maintains dimensional stability and comprises a plastic, a resin, a polymer-based material, a thermoplastic material, an epoxy resin material, a polyester material, a dielectric material, or a silicon-containing material.

4. The integrated circuit chip package of claim 1, wherein the compliant element is manufactured by injection molding.

5. The integrated circuit chip package of claim 1, wherein the compliant element is affixed to the stiffener by screws, fasteners, pins, rods, clamps, adhesives, or epoxies.

6. The integrated circuit chip package of claim 1, wherein a coefficient of thermal expansion (CTE) of the compliant element is substantially equal to a CTE of the substrate.

7. The integrated circuit chip package of claim 1, wherein a thermal conductivity rate of the thermally-conductive element varies with a thermal conductivity rate of the compliant element.

8. The integrated circuit chip package of claim 1, wherein the thermally-conductive element comprises copper, copper alloy, aluminum, aluminum alloy, carbon compound, steel, steel alloy, or combinations thereof.

9. The integrated circuit chip package of claim 1, wherein the two horizontally distinct, thermally-conductive areas of the thermally-conductive element are configured to match a non-uniform heat signature of the chip.

10. The integrated circuit chip package of claim 1, wherein the thermally-conductive element is configured to match a coefficient of thermal expansion (CTE) of the chip or a CTE of the substrate.

11. An integrated circuit chip package, comprising:
    a substrate;
    a chip attached to the substrate;
    a stiffener mounted above a surface of the substrate and surrounding the chip; and
    a heat spreader mounted above the stiffener for sealing the chip therein, the heat spreader comprising:
       a passive, thermally-conductive element, having a side opposed to a top surface of the chip for transmitting heat away from the chip to the heat spreader, the thermally-conductive element comprising two or more horizontally distinct, thermally-conductive areas, positioned side by side in a direction parallel to the top surface of the chip, having different thermal conductivity, the thermally-conductive areas comprising different metals, wherein each horizontally distinct, thermally-conductive area of the two horizontally distinct, thermally-conductive areas comprises a single metal;
       a compliant element, having a first portion attached to and positioned around the periphery of the thermally-conductive element and a second portion affixed to a surface of the stiffener, wherein the thermally-conductive element has thermal conductivity higher than that of the compliant element, and
    wherein a surface of the compliant element closest to the top surface of the chip and a surface of the thermally-conductive element closest to the top surface of the chip are substantially coplanar where the first portion of the compliant element meets the periphery of the thermally-conductive element.

12. The integrated circuit chip package of claim 11, further comprising a thermal interface material (TIM) disposed between the chip and the heat spreader for transmitting heat generated from the chip to the heat spreader.

13. The integrated circuit chip package of claim 11, wherein the compliant element is pliable yet maintains dimensional stability and comprises a plastic, a resin, a polymer-based material, a thermoplastic material, an epoxy resin material, a polyester material, a dielectric material, or a silicon-containing material.

14. The integrated circuit chip package of claim 11, wherein the compliant element is manufactured by injection molding.

15. The integrated circuit chip package of claim 11, wherein the compliant element is affixed to the substrate by screws, fasteners, pins, rods, clamps, adhesives, or epoxies.

16. The integrated circuit chip package of claim 11, wherein a coefficient of thermal expansion (CTE) of the compliant element is substantially equal to a CTE of the substrate and/or the stiffener.

17. The integrated circuit chip package of claim 11, wherein a thermal conductivity rate of the thermally-conductive element varies with a thermal conductivity rate of the compliant element.

18. The integrated circuit chip package of claim 11, wherein the thermally-conductive element comprises copper, copper alloy, aluminum, aluminum alloy, carbon compound, steel, steel alloy, or combinations thereof.

19. The integrated circuit chip package of claim 11, wherein the thermally-conductive element is configured to match a non-uniform heat signature of the chip.

20. The integrated circuit chip package of claim 11, wherein the thermally-conductive element is configured to match a coefficient of thermal expansion (CTE) of the chip, the stiffener, and/or the substrate.

21. A heat spreader for transmitting heat generated from a chip attached to a substrate in a semiconductor packaging, the heat spreader comprising:
- a passive, thermally-conductive element, having a side opposed to a top surface of the chip, the thermally-conductive element comprising two or more horizontally distinct, thermally-conductive areas, positioned side by side in a direction parallel to the top surface of the chip, having different thermal conductivity, the thermally-conductive areas comprising different metals, wherein each horizontally distinct, thermally-conductive area of the two horizontally distinct, thermally-conductive areas comprises a single metal;
- a compliant element having a sidewall attached to and positioned around the periphery of the thermally-conductive element and a bottom surface affixed to a surface of the substrate, wherein the thermally-conductive element has thermal conductivity higher than that of the compliant element, and wherein a surface of the compliant element closest to the top surface of the chip and a surface of the thermally-conductive element closest to the top surface of the chip are substantially coplanar where the first portion of the compliant element meets the periphery of the thermally-conductive element.

22. The heat spreader of claim 21, wherein the heat spreader comprises a non-homogenous material.

23. The heat spreader of claim 21, wherein the compliant element is pliable yet maintains dimensional stability and comprises a plastic, a resin, a polymer-based material, a thermoplastic material, an epoxy resin material, a polyester material, a dielectric material, or a silicon-containing material.

24. The heat spreader of claim 21, wherein the compliant element is manufactured by injection molding.

25. The heat spreader of claim 21, wherein a thermal conductivity rate of the thermally-conductive element varies with a thermal conductivity rate of the compliant element.

26. The heat spreader of claim 21, wherein the thermally-conductive element comprises copper, copper alloy, aluminum, aluminum alloy, carbon compound, steel, steel alloy, or combinations thereof.

27. The heat spreader of claim 21, wherein the thermally-conductive element is configured to match a non-uniform heat signature of the chip.

* * * * *